United States Patent [19]

Malladi et al.

[11] Patent Number: 4,714,517

[45] Date of Patent: Dec. 22, 1987

[54] COPPER CLEANING AND PASSIVATING FOR TAPE AUTOMATED BONDING

[75] Inventors: Devi P. Malladi, Campbell; Ranjan Mathew, San Jose; Divyesh P. Shah, Sunnyvale, all of Calif.

[73] Assignee: National Semiconductor Corporation, Santa Clara, Calif.

[21] Appl. No.: 861,210

[22] Filed: May 8, 1986

[51] Int. Cl.$^4$ .............................. C23F 1/00; B44C 1/22; C03C 15/00; C03C 25/06
[52] U.S. Cl. ........................................ 156/629; 134/3; 134/22.19; 134/28; 134/29; 134/41; 156/634; 156/656; 156/666; 156/901; 252/79.2; 252/79.4; 252/79.5
[58] Field of Search ................... 134/3, 22.19, 28, 29, 134/41; 252/79.2, 79.4, 79.5; 156/629, 634, 656, 659.1, 666, 901

[56] References Cited

U.S. PATENT DOCUMENTS

| | | | |
|---|---|---|---|
| 2,318,559 | 5/1943 | Percival | 156/666 X |
| 2,382,865 | 8/1945 | Dittmar | 156/666 |
| 3,095,379 | 6/1963 | Schwartz | 156/666 X |
| 4,127,438 | 11/1978 | Babcock et al. | 156/666 |
| 4,264,418 | 4/1981 | Wood et al. | 156/666 X |

*Primary Examiner*—William A. Powell
*Attorney, Agent, or Firm*—Gail W. Woodward

[57] ABSTRACT

In the preparation of copper parts for the tape automated bonding of semiconductor devices, the copper parts are subjected to a mild organic acid. This treatment etches the copper, removes contaminants and passivates the surfaces so that subsequent oxidation is retarded. In the case where the copper parts are the bumps on a semiconductor wafer selective etching is avoided.

8 Claims, No Drawings

COPPER CLEANING AND PASSIVATING FOR TAPE AUTOMATED BONDING

BACKGROUND OF THE INVENTION

The invention relates to the cleaning and passivation of the copper products employed in tape automated bonding (TAB) in semiconductor device packaging. Here a copper tape is provided with a series of metal finger patterns along its length. The fingers in each pattern extend inwardly to form an array that mates with the bonding pad array on a semiconductor device such as an integrated circuit (IC). In the earliest approach the IC's were treated while in wafer form to provide raised or bumped bonding pads to which flat copper fingers are TC bonded. The bumped bonding pads typically included an upper layer of copper usually located over a nickel barrier layer. The bumped bonding pads act to stand the metal fingers off of the chip surface so that short circuits are avoided. In a later developed system the bonding pads are kept flat and relatively thin. The meta tape finger ends incorporate raised bumps that can be thermocompression (TC) bonded to the flat bonding pads on the IC. All of the pads can be bonded to the metal tape fingers simultaneously in a gang bonding operation. Once the IC pads have been bonded to the tape fingers, in what is called an inner lead bonding (ILB) operation, the chip becomes mechanically attached to the tape and is transported and handled therewith in subsequent operations.

It is important that the copper bumps and/or tape be cleaned to eliminate oxides that can interfere with the bonding operation both of ILB and in the subsequent bonding of the attached fingers to some other structure. Typically, the copper is cleaned by treating it with a sulhuric acid pickling bath. This treatment actually removes a thin surface layer of copper thereby to expose a new clean surfavr. This is a drastic treatment and leaves a copper surface that is fully exposed to the atmosphere which can result in further oxidation. That is, the copper is not passivated.

U.S. Pat. No. 3,806,366 relates to the continuous pickling of cast copper rod stock. As the rod emerges from a rolling mill it is hot and is desirably quenched before further treatment. The quench can be produced using a pickling bath that includes a mild organic acid such as citric acid. Thus, the pickling process makes use of the heat from the rod in order to accelerate the pickling operation. The sudden cooling of the rod stock causes it to contract and thereby burst off the oxides from the surface and expose it to the mild acid.

U.S. Pat. No. 2,318,559 relates to a copper pickling bath that contains ferric salts and a relatively small amount or organic acid. The object is to produce a smooth, bright and natural appearing copper surface.

U.S. Pat. No. 4,188,438, which is assigned to the assignee of the present invention, covers the concept of providing the copper surfaces in a TAB process with a corrosion resistant coating that is thin enough so that the coated surface can be TC bonded through the coating. This reference also teaches the various elements of TAB using the bumped bonding pad approach U.S. Pat. No. 4,005,472, which is also assigned to the assignee of the present invention, shows the coating of the wafer bumps with electroless gold in a thin layer after the bumps have been cleaned to remove any surface oxides.

The teaching in the above citations is incorporated herein by reference.

SUMMARY OF THE INVENTION

It is an object of the invention to provide a copper cleaning bath whereby oxides are removed and the copper surface is passivated against further oxidation.

It is a further object of the invention to clean a copper surface to remove surface oxides so that a reliable TC bond can be made to the bonding pads of an IC.

It is a still further object of the invention to provide a cleaning bath useful on a copper tape or copper bump on a semiconductor wafer wherein the copper can be cleaned and reliably bonded without harm to the associated semiconductor devices.

These and other objects are achieved as follows. The copper to be cleaned is first immersed in a conventional acid bath to remove scale, oxides and contaminants along with a surface layer of copper. Then the copper is rinsed and then subjected to an aqueous solution of a mild organic acid such as citric, tartaric, oxalic, malonic, succinic, glutaric, adipic, maleic, acetic, formic, propionic, butyric, valeric, or caproic acid. This treatment results in a bright clean copper surface that is substantially passivated against further oxidation. We have discovered that such a treatment is very effective in cleaning the copper tape or bumps that are to be employed in TAB. The result is a copper surface that can be readily TC bonded.

DESCRIPTION OF THE INVENTION

The invention resides in the cleaning of copper elements, that are to be TC bonded, in a mild organic acid which cleans the copper surface and produces a passivated surface that does not readily oxidize upon exposure to the atmosphere. The cleaning operation can be applied to the copper bumps on a bumped semiconductor wafer or to the copper tape used in TAB. After the cleaning operation the parts can be TC bonded without difficulty even after relatively long periods in the atmosphere. In the prior art cleaning processes the bonding had to take place within a short time in order to avoid oxidation problems.

In the cleaning operation it is desirable to incorporate the treatment with the mild organic acid following the photoresist stripping operation associated with the photolithographic etching of the parts. The treatment is accomplished by passing the parts through a succession of tanks that contain the sequence of treatment chemicals. Where the parts involve a TAB tape, the tape is passed from a supply reel through the various tanks, including interspersed rinsing stations, and it is finally rinsed and dried after which it is coiled up on a take-up reel. When the parts include semiconductor wafers they are located in holders that are passed through an automatic treatment machine which subjects them to a sequence of chemical sprays. Finally, the wafers are rinsed and spun dry under an air flow.

In a typical operation the parts are first subjected to a photoresist stripping solution which is ordinarily a strong base solution. In the prior art the parts were then typically passed through a sulfuric acid or sulfuric acid-peroxide bath which acted to remove a surface layer of the copper. Alternatively, a nitric acid etch could be employed. The parts were then rinsed and dried to be ready for the TC bonding operation. In the invention the sulfuric, sulfuric-peroxide, or nitric acid etch is replaced with a mild organic acid with citric, oxalic or acetic acids being preferred. However, alternatives such as tartaric, malonic, succinic, glutaric, adipic, maleic, formic, propionic, butyric, valeric, or caproic acids can be used. This acid bath slowly etches the copper and at the same time provides a passivated copper surface which will resist oxidation subsequently. This passivating action greatly enhances the TC bondability of the parts after they have been stored following cleaning.

If desired, the conventional strong acid etching treatment of the copper parts can be performed and then followed with the mild organic acid treatment. This is acceptable as long as the last rinse is preceded by a mild organic acid treatment.

One of the major advantages of the invention is found in the treatment of copper bumped semiconductor wafers. In this case, the conventional aluminum IC bonding pads are covered with a raised copper bump. If desired, an interposed barrier metal such as nickel is present. In any event, the bump surface to be treated is copper. It has been noted that a typical IC will tend to etch some of the bumps more than others. When aluminum is present in the system an electrochemical couple is set up which will accelerate preferential copper removal. since the IC configuration will act to modify the electrical behavior of the copper bumps certain ones will tend to be over-etched in the process. Thus, for a particular IC, certain bumps will tend to over etch even though the process is purely a chemical one. We have found that when using the mild organic acid etching this preferential etching is avoided. After the bump etching is completed the wafer is immersed in an electroless gold plating solution which proceeds to deposit a thin layer of gold on the exposed copper bumps. This is taught in U.S. Pat. No. 4,05,472 referenced above. The thin gold layer prevents any oxidation of the copper and the TC bond can take place through the gold coating. Thus, when a copper finger is TC bonded to the copper bump with the thin gold coating, a copper to copper bond is achieved.

When the invention is employed in the production of copper assembly tape the mild organic acid treatment passivates the copper. This retards any subsequent oxidation so the TC bond does not have to be made immediately. It has been found that when the tape is handled in reel form, the reel can be stored for several months prior to bonding if desired. When long term storage is expected it is considered good practice to store the tape reels in a plastic bags that are filled with an inert gas and heat sealed. Such storage permits storage of the tape product for many months prior to use in TAB.

EXAMPLE 1

Copper tape parts were photolithographically etched in a conventional process. They were then subjected to a proprietary stripper bath that acted to remove the photoresist. Such a proprietary stripper is available as a positive photoresist stripper 1112 from the Shippley Company. This material is a strong base such as ethanol diamine. The parts were then subjected to either NaOH, tetramethyl ammonium hydroxide (TMAH), or a second stripper bath followed by treatment using a mild organic acid. The following chart shows the process used and the residues subsequently detected on the copper parts. In this chart deionized water rinses are inserted between tank 2 and 3, tank 3 and 4, and after tank 4. The parts were then dried and tested in an ion chromatograph to show contaminants.

EXAMPLE 1

| PROCESS (TANK SEQUENCE) | | | | CONTAMINANTS in u GRAMS/CM$^2$ | | | |
|---|---|---|---|---|---|---|---|
| Tank 1 | Tank 2 | Tank 3 | Tank 4 | Cl$^-$ | NO$_2^-$ | SO$_4^=$ | CH$_3$CO$_2^-$ |
| STRIPPER | 10% N$_a$OH | 10% CITRIC | 10% OXALIC | 0.034 | 0.070 | 0.012 | — |
| STRIPPER | STRIPPER | 10% OXALIC | 10% NH$_4$OH | 0.031 | 0.068 | — | — |
| STRIPPER | 10% TMAH | 10% NH$_4$OH | 10% CITRIC | 0.020 | 0.065 | — | — |
| STRIPPER | 10% TMAH | 10% OXALIC | 10% CITRIC | 0.019 | 0.072 | — | — |
| STRIPPER | STRIPPER | 10% CITRIC | 10% OXALIC | 0.030 | 0.159 | — | — |
| STRIPPER | STRIPPER | 10% NH$_4$OH | 10% CITRIC | 0.032 | 0.208 | — | — |
| STRIPPER | 10% TMAH | 10% OXALIC | 10% NH$_4$OH | — | 0.020 | — | — |
| STRIPPER | 10% N$_a$OH | 10% NH$_4$OH | 10% CITRIC | — | 0.011 | — | — |
| STRIPPER | 10% N$_a$OH | 10% NH$_4$OH | 10% OXALIC | 0.010 | 0.120 | 0.013 | — |
| 10% NaOH | 10% TMAH | 10% CITRIC | 10% OXALIC | 0.0028 | 0.018 | — | — |
| 10% NaOH | 10% TMAH | 10% NH$_4$OH | 10% CITRIC | 0.019 | 0.115 | 0.028 | — |
| 10% NaOH | 10% TMAH | 10% NH$_4$OH | 10% OXALIC | 0.025 | 0.206 | 0.028 | — |
| STRIPPER | STRIPPER | 10% OXALIC | 10% ACETIC +1.4% H$_2$O$_2$ | — | 0.019 | — | 0.105 |
| STRIPPER | 10% TMAH | 10% CITRIC | 10% OXALIC | — | 0.025 | — | 0.112 |
| 10% TMAH | STRIPPER | 10% OXALIC | 10% CITRIC | 0.034 | 0.347 | 0.032 | — |
| 10% TMAH | 10% NaOH | 10% CITRIC | 10% OXALIC | — | 0.014 | — | — |
| STRIPPER | STRIPPER | 10% Acetic +1.4% H$_2$O$_2$ | 10% CITRIC | 0.051 | 0.142 | — | — |
| STRIPPER | STRIPPER | 10% ACETIC +1.4% H$_2$O$_2$ | 10% OXALIC | — | 0.011 | — | — |
| STRIPPER | STRIPPER | 10% EDTA | 10% CITRIC | — | 0.016 | — | — |
| STRIPPER | 10% N$_a$OH | 10% CITRIC | 10% EDTA | — | 0.019 | — | — |
| STRIPPER | 10% N$_a$OH | 10% OXALIC | 10% EDTA | — | 0.019 | — | — |
| STRIPPER | 10% N$_a$OH | 10% EDTA | 10% OXALIC | — | 0.014 | — | — |
| STRIPPER | STRIPPER | 10% CITRIC | 10% CITRIC | — | 0.026 | — | — |
| STRIPPER | STRIPPER | 10% OXALIC | 10% OXALIC | — | 0.021 | — | — |
| STRIPPER | STRIPPER | 10% OXALIC | 10% CITRIC | — | 0.016 | — | — |
| STRIPPER | STRIPPER | 10% OXALIC | 10% CITRIC | — | 0.017 | — | — |
| STRIPPER | STRIPPER | D.I. WATER | D.I. WATER | — | 0.012 | — | — |
| STRIPPER | STRIPPER | 10% H$_2$SO$_4$ | D.I. WATER | — | 0.019 | — | — |
| STRIPPER | STRIPPER | 10% H$_2$SO$_4$ | D.I. WATER | — | 0.013 | — | — |
| STRIPPER | STRIPPER | 10% CITRIC | D.I. WATER | — | 0.015 | — | — |
| STRIPPER | STRIPPER | 10% CITRIC | D.I. WATER | — | 0.020 | — | — |

-continued

EXAMPLE 1

| PROCESS (TANK SEQUENCE) | | | | CONTAMINANTS in u GRAMS/CM$^2$ | | | |
|---|---|---|---|---|---|---|---|
| Tank 1 | Tank 2 | Tank 3 | Tank 4 | Cl$^-$ | NO$_2^-$ | SO$_4^=$ | CH$_3$CO$_2^-$ |
| CONTROL | conventional stripping and etching | | | .0005 | 0.005 | — | 0.023 |
| CONTROL | conventional stripping and etching | | | .013 | 0.100 | — | — |

EXAMPLE 2

Clean copper parts were oxidized by heating them in air. They were then treated as follows:

| TREATMENT | EFFECT |
|---|---|
| STRIPPER | No oxide removal. |
| 10% N$_a$OH | No change in the first 30 seconds. Overnight sample had a brown surface film. |
| 10% TMAH | No change in the first 30 seconds. Overnight sample had a black surface film. |
| 10% NH$_4$OH | Slight etch in 30 seconds, solution turned light blue; overnight sample partially etched |
| 2% H$_2$SO$_4$ + 4% H$_2$O$_2$ | Removed Oxide rapidly. |
| 10% H$_2$SO$_4$ | Removed Oxide slower than 2% H$_2$SO$_4$ + 4% H$_2$O$_2$. |
| 10% ACETIC + 1.4% H$_2$O$_2$ | Removed Oxide slowly. |
| 10% CITRIC | Removed Oxide slower than 10% ACETIC + 1.4% H$_2$O$_2$ |
| 10% OXALIC | Removed Oxide at the slowest rate |

EXAMPLE 3

IC chips with copper bumps located on the bonding pads were first oxidized in air at 175° C. for 30 minutes and then subjected to the cleaning solutions to remove the oxide. The chips each had an array of 3×3 logic circuits fabricated using low power Schottky construction. It was found that certain of the copper bumps etched preferentially in the cleaning solution. The preferential etch is expressed as a ratio of copper removed from the rapidly removed bump versus the copper removed from the rapidly removed bump versus the copper removed from a reference bump. The following preferential etching was noted:

| ETCH | TIME (MINUTES) | BUMP WEIGHT (RATIO) |
|---|---|---|
| 1.5% H$_2$SO$_4$ | 1 | 1.13 |
| 1.5% H$_2$SO$_4$ | 6 | 10 |
| 6% CITRIC | 3 | 1.12 |
| 6% CITRIC | 6 | 1.21 |
| 10% CITRIC | 1 | 1.02 |
| 10% CITRIC | 3 | 1.04 |
| 10% CITRIC | 6 | 1.19 |
| 20% CITRIC | 1 | 1.01 |
| 20% CITRIC | 3 | 1.12 |
| 20% CITRIC | 6 | 1.07 |
| 40% CITRIC | 1 | 1.08 |
| 40% CITRIC | 6 | 1.09 |
| 10% ACETIC | 1 | 1.09 |
| 25% ACETIC | 1 | 1.14 |
| 25% ACETIC | 6 | 1.22 |

The invention has been described and the performance of a number of cleaning solutions detailed. When a person skilled in the art reads the foregoing description, alternatives and equivalents, within the spirit and intent of the invention, will be apparent. Accordingly, it is intended that the scope of the invention be limited only by the following claims.

We claim:

1. In the process for cleaning and passivating copper parts that are to be employed for assembling semiconductor devices the steps of:
   cleaning said copper parts in a strong caustic solution;
   passivating said copper parts in an aqueous solution of a mild organic acid;
   rinsing said copper parts in water;
   drying said copper parts; and
   thermocompression bonding said cleaned and passivated parts.

2. The process of claim 1 wherein said mild organic acid is selected from the group consisting of citric, acetic, oxalic, tartaric, malonic, succinic, glutaric, adipic, maleic, formic, propronic, butyric, valeric and caproic acids.

3. The process of claim 1 wherein said mild organic acid is acetic acid.

4. The process of claim 1 wherein said mild organic acid is citric acid.

5. The process of claim 1 wherein said mild organic acid is oxalic acid.

6. The process of claim 1 wherein said copper parts are further subjected to an acid etching solution.

7. The process of claim 6 wherein said acid etching solution is an aqueous solution of sulfuric acid.

8. The process of claim 7 wherein said aqueous solution of sulfuric acid further contains hydrogen peroxide.

* * * * *